United States Patent
Do et al.

(10) Patent No.: US 9,933,300 B2
(45) Date of Patent: Apr. 3, 2018

(54) ULTRA-HIGH DYNAMIC RANGE TWO PHOTODIODE PIXEL ARCHITECTURE

(71) Applicant: BAE Systems Imaging Solutions Inc., San Jose, CA (US)

(72) Inventors: Hung T Do, San Jose, CA (US); Alberto M Magnani, Danville, CA (US); R Daniel McGrath, Lexington, MA (US)

(73) Assignee: BAE Systems Imaging Solutions Inc., San Jose, CA (US)

( * ) Notice: Subject to any disclaimer, the term of this patent is extended or adjusted under 35 U.S.C. 154(b) by 129 days.

(21) Appl. No.: 15/050,666

(22) Filed: Feb. 23, 2016

(65) Prior Publication Data
US 2017/0241835 A1    Aug. 24, 2017

(51) Int. Cl.
*G01J 1/42*    (2006.01)
*H01L 27/146*    (2006.01)

(52) U.S. Cl.
CPC ........ *G01J 1/4228* (2013.01); *H01L 27/1461* (2013.01); *H01L 27/14614* (2013.01); *H01L 27/14636* (2013.01); *H01L 27/14641* (2013.01); *H01L 27/14643* (2013.01)

(58) Field of Classification Search
CPC ............... H04N 4/3745; H04N 5/2175; H01L 27/14609; H01L 27/14641; H01L 27/14612; H01L 27/14654; H01L 27/146; H01L 27/14614; H01L 27/14636; H01L 27/14643; G01J 1/4228
USPC .......................................... 250/208.1, 214 R
See application file for complete search history.

(56) References Cited

U.S. PATENT DOCUMENTS

| | | | |
|---|---|---|---|
| 5,898,168 A | 4/1999 | Gowda et al. | |
| 7,759,756 B2* | 7/2010 | Lee | H01L 27/14647 257/225 |
| 8,698,930 B2* | 4/2014 | Kinugasa | H01L 27/14641 348/296 |
| 2007/0102780 A1 | 5/2007 | Luo | |
| 2015/0008307 A1 | 1/2015 | Fowler | |

OTHER PUBLICATIONS

International Search Report, PCT/US17/18622, dated May 5, 2017, 9 pages.

* cited by examiner

*Primary Examiner* — Que T Le
(74) *Attorney, Agent, or Firm* — Maine Cernota & Rardin

(57) ABSTRACT

A pixel comprises a high-response photodiode that collects photocharge, a first transfer gate that enables the charge to be transferred off the high-response photodiode, completely emptying it onto a low-response photodiode, a second transfer gate enables the charge to be transferred off the low-response photodiode, completely emptying it onto floating diffusion, a third transfer gate for anti-blooming; the floating diffusion collects the transferred charge creating a change of voltage, a means of resetting the floating diffusion. A source-follower is modulated by the voltage on floating diffusion to control bit-line voltage and column-amplifier output. In examples, photocharge is integrated onto both the high-response photodiode and onto the low-response photodiode. The column readout circuit consists of a column amplifier that uses capacitors to set the amplifier gain, three sampling capacitors used as analog memory and for correlated double sampling, and a comparator that assists in providing the final output.

23 Claims, 5 Drawing Sheets

COLUMN READOUT CIRCUITS

READOUT TIMING

MODIFIED PIXEL

IMPROVED UDR PIXEL DETAIL

FLOW CHART

ULTRA-HIGH DYNAMIC RANGE TWO PHOTODIODE PIXEL ARCHITECTURE

FIELD

Embodiments relate to CMOS image sensors, and more particularly, to an ultra-high dynamic range pixel architecture.

BACKGROUND

A challenge in designing image sensors is the need for the image sensor to exhibit a very wide dynamic range. Fields include general photography and video (cinematography, broadcast, personal photography, etc.), aerial photography (intelligence gathering), agricultural photography (crop analysis), product inspection, medical applications, and automotive applications. In many applications, particularly outdoor, the image sensor is required to have a wide dynamic range to account for very bright and very dark areas. Applications may have lighting conditions from below 1 lux for night vision to over 10,000 lux for bright sunlight. Real world scenes may have illumination intensities varying over a dB range of 100 or more. While biological vision systems and silver halide film can image high dynamic range (100+ dB) scenes with little loss of contrast information, it has been challenging to develop electronic image sensors with this range.

Most current image sensors have limited dynamic ranges, typically between 50 dB to 80 dB. Because of this, relevant information content of the captured scene is lost. Additionally, the large variation of illumination intensity can manifest itself in image blooming for scenes with very bright areas. The pixels illuminated by the very bright light saturate and flood signal onto adjacent pixels so that the bright areas of the output image grow and the true image is lost. CMOS image sensors generally suffer from poor image quality because CMOS image sensors generally have a low dynamic range in image capability. Conventional CMOS image sensors are capable of recording approximately 10 bits of a scene's dynamic range. Methods for improving the dynamic range of CMOS image sensors have been applied to improve the quality of the captured image. However, these methods do not meet the needs for ultrawide dynamic range (UDR) image sensors.

The challenge is to create a wide dynamic range image sensor having sufficient optical sensitivity in shadow areas where there is low illumination and sufficient sensitivity range for bright areas with high illumination, and for highlights with very bright illumination. To accomplish this requires having simultaneously very low noise for the low illumination and very low optical speed for high illumination. It is important that signal-to-noise behavior is good over the whole illumination range for a set of images making up a video stream.

What is needed is an improved ultra-high dynamic range (UDR) image sensor that can more accurately capture image scenes.

SUMMARY

An embodiment provides an ultra-high dynamic range pixel comprising a high-response photodiode; a first transfer gate in electrical contact with the high-response photodiode; a low-response photodiode in electrical contact with the first transfer gate; a second transfer gate in electrical contact with the low-response photodiode; a floating diffusion in electrical contact with the second transfer gate; a means of resetting the floating diffusion; and a source-follower in electrical contact with the floating diffusion. In embodiments, the high-response photodiode collects photocharge and the high-response photodiode has a higher quantum efficiency than the low-response photodiode. In other embodiments, the first transfer gate enables a charge to be transferred off the high-response photodiode, completely emptying it onto the low-response photodiode. In subsequent embodiments, the second transfer gate enables a charge to be transferred off the low-response photodiode, completely emptying it onto the floating diffusion. For additional embodiments the floating diffusion collects a transferred charge creating a change of voltage. In another embodiment, the source-follower is modulated by a voltage on the floating diffusion to control a voltage on an output signal line. For a following embodiment, a photocharge is integrated onto both the high response photodiode and onto the low-response photodiode. In subsequent embodiments, the low-response photodiode is an isolated diode without contacts to interconnect layers, thereby including lower dark defects. Additional embodiments further comprise a third transfer gate in electrical contact with the high-response photodiode.

Another embodiment provides a method for reading out an ultra-high dynamic range pixel comprising the steps of integrating one frame; integrating a high-response photocharge onto a high-response photodiode; integrating a low-response photocharge onto a low-response photodiode; resetting a floating diffusion; resetting a column amplifier to create a reference voltage; capturing the reference voltage with a switch S1; transferring a low-response charge from the low-response photodiode to the floating diffusion; capturing a voltage V2 with a switch S2; transferring a high-response charge from the high-response photodiode through the low-response photodiode to the floating diffusion; adding a charge to the low-response charge already present; capturing a voltage V3 with a switch S3; the switch S3 going low; Comp_en going high to enable a comparator; if the voltage V2 is higher than a threshold voltage VT, sel is high, and sel complement is low, then V2, Voutm, and sel are read out; and if the voltage V2 is lower than the threshold voltage VT, sel is low, and sel complement is high, then V3, Voutm, and sel are read out. In included embodiments, the comparator outputs sel and sel complement are non-overlap signals, thereby avoiding charge sharing between capacitors C2 and C3. In yet further embodiments, the threshold voltage VT is adjusted to get an optimized dynamic range. In related embodiments, a signal for a low end of an optical response is a difference of the high-response signal V3 and the combined reset Voutm. For further embodiments, a signal for a high end of an optical response is a difference of the low-response signal V2 and the combined reset Voutm. In ensuing embodiments, a signal for a low end of an optical response and a signal for a high end of an optical response have significantly different responses because the high-response photodiode has a higher quantum efficiency than the low-response photodiode. For yet further embodiments, a line readout requires only three readouts of combined reset, low-response readout, and high-response readout. For more embodiments, a first transfer gate enables the high-response charge to be transferred off of the high-response photodiode, completely emptying it onto the low-response photodiode. Continued embodiments include a second transfer gate that enables the low-response charge to be transferred off the low-response photodiode completely emptying it onto the floating diffusion. For additional embodiments, both low-response readout and high-response readout have the same polarity.

A yet further embodiment provides an ultra-high dynamic range pixel imaging system comprising a high-response photodiode; a first transfer gate in electrical contact with the high-response photodiode; a low-response photodiode in electrical contact with the first transfer gate; a second transfer gate in electrical contact with the low-response photodiode; a floating diffusion in electrical contact with the second transfer gate; a means of resetting the floating diffusion; a source-follower in electrical contact with the floating diffusion; integrating a high-response photocharge onto the high-response photodiode; integrating a low-response photocharge onto the low-response photodiode, wherein amounts of the high response charge and the low response charge integrated onto the high-response and the low-response photodiodes are different; resetting the floating diffusion; resetting a column amplifier to create a reference voltage; capturing the reference voltage with a switch S1; transferring a low-response charge from the low-response photodiode to the floating diffusion; capturing a voltage V2 with a switch S2; transferring a high-response charge from the high-response photodiode through the low-response photodiode to the floating diffusion; adding a charge to the low-response charge already present; capturing a voltage V3 with a switch S3; the switch S3 going low; a Comp_en going high to enable a comparator; if the voltage V2 is higher than a threshold voltage VT, a sel is high and a sel complement is low, then V2, Voutm, and sel are read out; and if the voltage V2 is lower than the threshold voltage VT, sel is low, and sel complement is high, then V3, Voutm, and sel are read out.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Embodiments use a modified version of the traditional CMOS image sensor active pixel and deliver extreme low-light sensitivity with a dynamic range greater than 120 dB, and a read noise of 1 electron RMS and low dark current.

Embodiment structures differ from those discussed in the literature or those proposed to decrease dark current and dark defects for global shutter. In those cases, the goal is to create a storage node with effectively no optical response. For embodiments, the structure is engineered differently so as to have the storage node have a set amount of optical response.

Figure 1:
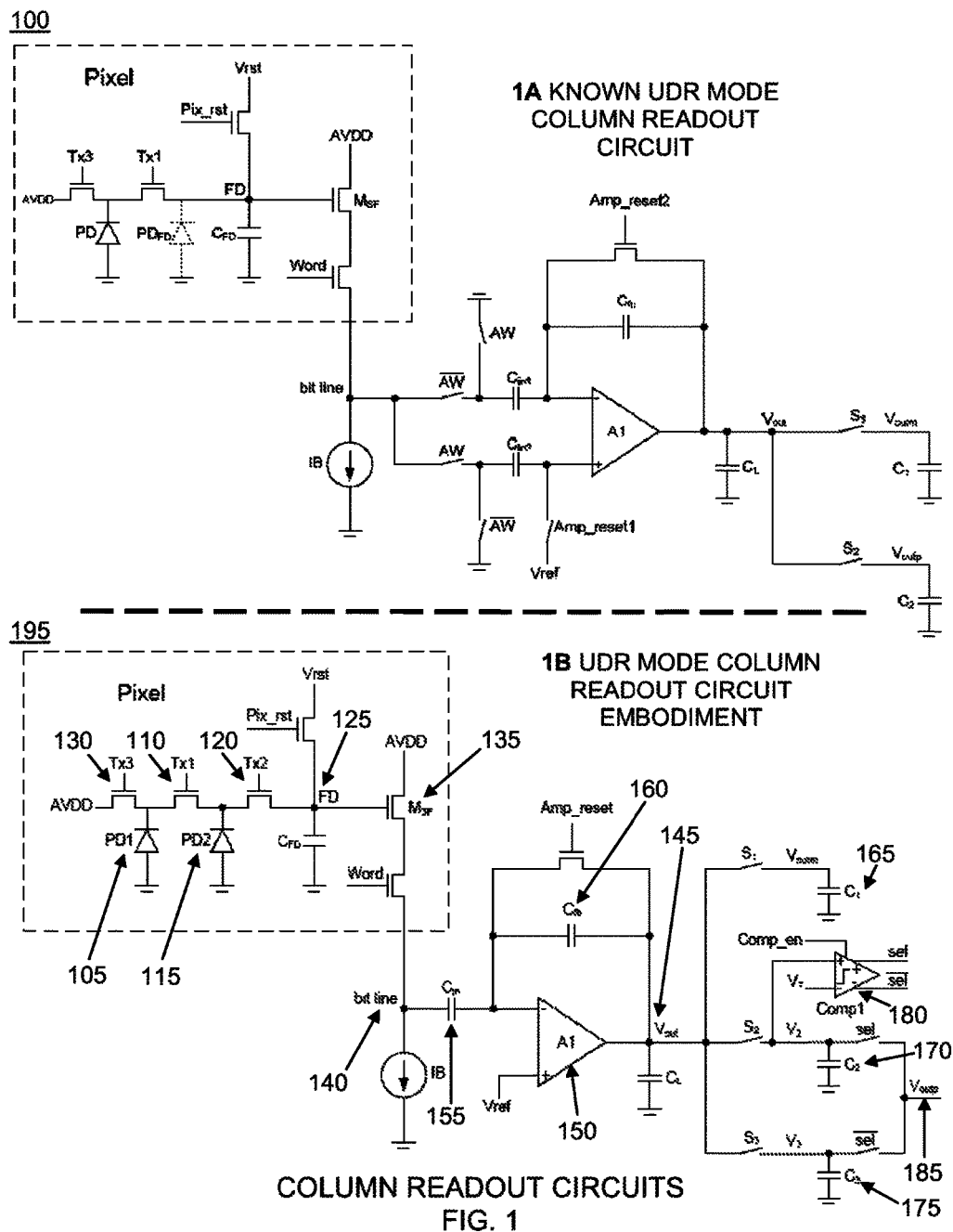
FIGS. 1A and 1B depict column readout circuits including a UDR mode configured in accordance with an embodiment.

FIG. 1 depicts a known column readout circuit 1A for a UDR mode, and novel column readout circuit 1B for a UDR mode.

FIG. 1A shows a readout circuit 100 used for a traditional CMOS image sensor active pixel. The pixel consists of a photodiode PD which collects photocharge, a transfer gate Tx1 that allows the charge to be transferred off the photodiode completely emptying it, a floating diffusion FD with parasitic diode $PD_{FD}$ and capacitor $C_{FD}$ that collects the transferred charge creating a change of voltage, a transfer gate Tx3 for anti-blooming (to remove excess charges as the photodiode PD is saturated or the maximum voltage swing at FD node is reached), a means of resetting the floating diffusion, and a source-follower $M_{SF}$ which is modulated by the voltage on the floating diffusion to control the bit-line voltage and column-amplifier output Vout. In this implementation, the photocharge is integrated onto both the photodiode PD with its optimized high response and onto the parasitic diode $PD_{FD}$ with an optical response that is tuned to be much lower. The column readout circuit consists of a column amplifier A1 that uses capacitors $C_{in1}$, $C_{in2}$ and $C_{fb}$ to set gains for 4T and 3T modes, and two sampling capacitors $C_1$ and $C_2$ which are used as analog memory and for correlated double sampling (CDS). This approach has at least three problems: 1) the floating diffusion readout has the 3T reset and the 3T signal as uncorrelated, so there is a square root of two increase in noise limiting its dynamic range compared to the photodiode readout where the 4T reset and 4T signal are correlated; 2) the readout requires separate readout for the reset levels for the photodiode and the floating diffusions so that each line readout is limited to including four readout times; and 3) the polarity between the two respective samples for the photodiode readout and for the floating diffusion readout are inverted from each other.

FIG. 1B shows readout circuit embodiment 195. The pixel comprises a high-response photodiode PD1 105 that collects photocharge, a first transfer gate Tx1 110 that enables the charge to be transferred off high-response photodiode PD1 105, completely emptying it onto low-response photodiode PD2 115, a second transfer gate Tx2 120 that enables the charge to be transferred off low-response photodiode PD2 115, completely emptying it onto floating diffusion FD 125, a third transfer gate Tx3 130 for anti-blooming, floating diffusion FD 125 collects the transferred charge creating a change of voltage, a means of resetting the floating diffusion. A source-follower $M_{SF}$ 135 is modulated by the voltage on floating diffusion FD 125 to control bit-line voltage 140 and column-amplifier output Vout 145. In this embodiment, photocharge is integrated onto both the high-response photodiode PD1 105 and onto the low-response photodiode PD2 115. The column readout circuit comprises a column amplifier A1 150 that uses capacitors $C_{in}$ 155 and $C_{fb}$ 160 to set the amplifier gain, three sampling capacitors $C_1$ 165, $C_2$ 170, and $C_3$ 175 which are used as analog memory and for correlated double sampling (CDS), and a comparator Comp1 180 that helps to get the final output Voutp 185. The final value of Voutp is dependent on the comparator outputs sel and $\overline{sel}$:

Case 1: Voutp=$V_3$ as: $V_2<V_T$, sel=low, $\overline{sel}$=high.
Case 2: Voutp=$V_2$ as: $V_2>V_T$, sel=high, $\overline{sel}$=low.

Advantages include (1) both the high-response and the low-response signals use a correlated reset, removing the square root of two increase for uncorrelated double sampling; (2) a line readout only requires three readouts (combined reset; low-response readout; high response readout); (3) both low-response readout and high-response readout have the same polarity. An additional advantage of this approach is that the low-response photodiode can be designed to provide lower dark defects because it is an isolated diode which does not require contacts to an interconnect layer as does the floating diffusion.

Figure 2:
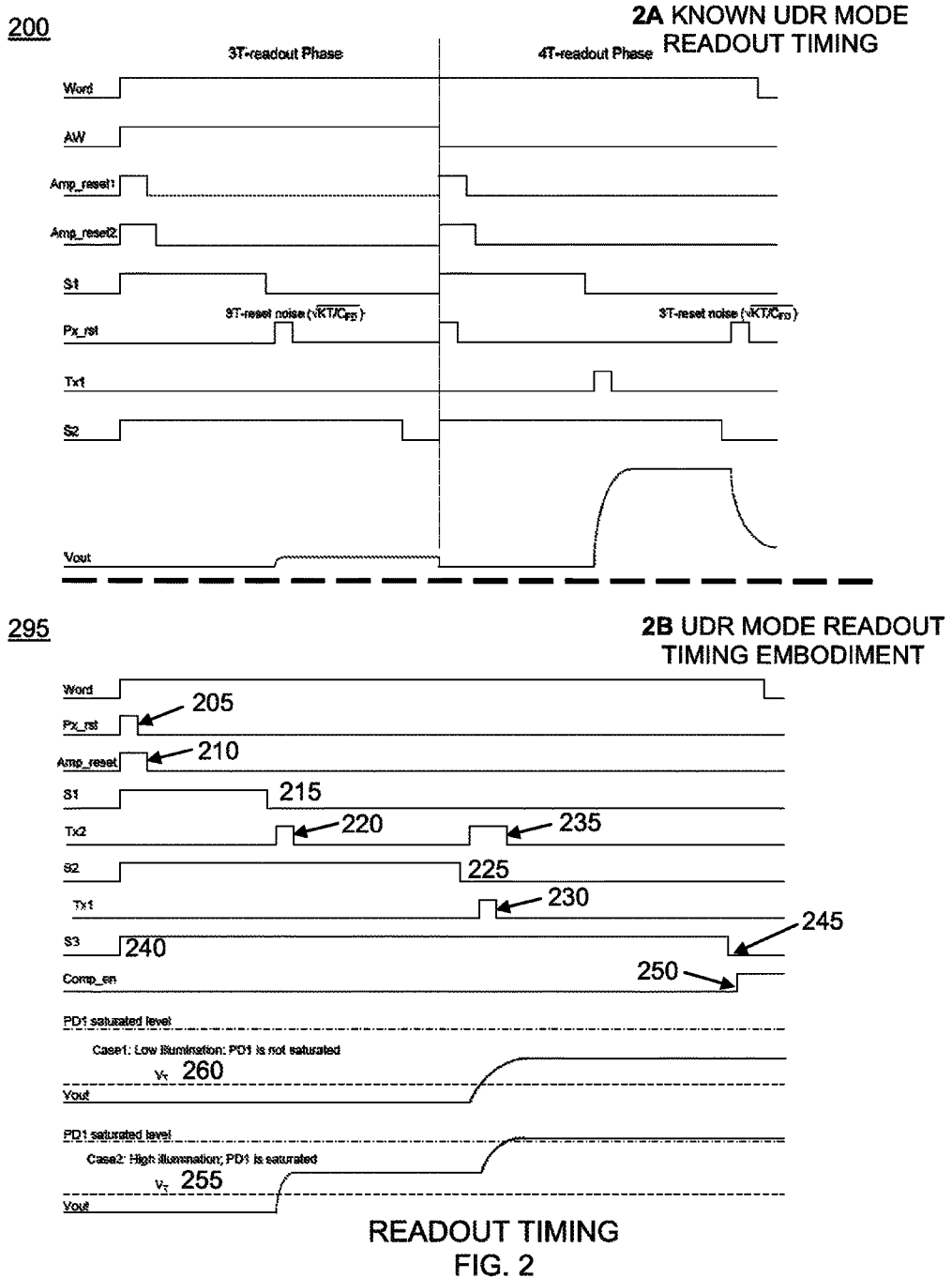
FIGS. 2A and 2B depict readout timing diagrams including a UDR mode configured in accordance with an embodiment.

FIG. 2 depicts known column readout timing 2A, and novel column readout timing 2B.

FIG. 2A shows readout timing 200 for a traditional implementation of FIG. 1A. The following steps show how the readout circuit operates. First, at the end of previous-frame 4T-readout phase, a pulse of Px_rst was used to reset the floating diffusion FD. After Px_rst went low, a 3T-reset noise ($\sqrt{KT/C_{FD}}$) was created on the capacitor $C_{FD}$. Second, after one frame of integrating, the photocharge is integrated onto both the photodiode PD and onto the parasitic diode $PD_{FD}$. Third, when the current frame starts, AW goes high to connect the bit line to the capacitor $C_{in2}$ and the amplifier A1 is reset to create the 3T reference voltage $V_{outm}$. During the 3T-readout phase, switch S1 is used to capture the 3T reference voltage. Fourth, the floating diffusion FD is reset by a Px_rst pulse and after that, switch S2 is used to capture the 3T signal voltage $V_{outp}$. In this case, after Px_rst goes low, another 3T-reset noise ($\sqrt{KT/C_{FD}}$) is added onto the capacitor $C_{FD}$. As a result, the total reset noise of the 3T-readout phase is equal to $\sqrt{2KT/C_{FD}}$. Fifth, AW goes low to connect the bit line to the capacitor $C_{in1}$ to start the 4T-readout phase. At the same time, the floating diffusion FD and the column amplifier A1 are also reset to create the 4T reference voltage $V_{outm}$. Switch S1 is used to capture the 4T reference voltage. Sixth, Tx1 transfers the photocharge from the photodiode PD to the floating diffusion FD to create the 4T signal voltage $V_{outp}$. Then, switch S2 is used to capture the 4T signal voltage. Seventh, the floating diffusion FD is reset to ready the voltage on it for the 3T-readout phase of the next frame. The signal for the low end of the optical response is the difference of 4T signal and 4T reset; the signal for the high end of the optical response is the difference of 3T signal and 3T reset. The two signals have significantly different response because the photodiode is designed to have higher quantum efficiency than the floating diffusion.

As previously mentioned regarding FIG. 1A, this approach has at least three problems: 1) The floating diffusion readout has the 3T reset and the 3T signal as uncorrelated, so there is a square root of two increase in noise, limiting its dynamic range compared to the photodiode readout where the 4T reset and 4T signal are correlated; 2) The readout requires separate readout for the reset levels for the photodiode and the floating diffusions so that each line readout is limited to including four readout times; and 3) The polarity between the two respective samples for the photodiode readout and for the floating diffusion readout are inverted from each other.

FIG. 2B shows the readout timing 295 for an embodiment of the improved UDR mode. The following steps show how the readout circuit operates. First, after one frame of integrating, the photocharge is integrated onto both the high-response photodiode PD1 and onto the low-response photodiode PD2. Second, a Px_rst pulse 205 is used to reset the floating diffusion FD. At this time, the column amplifier A1 is also reset by Amp_reset pulse 210 to create the reference voltage Voutm. Switch S1 215 is used to capture the reference voltage. Third, Tx2 pulse 220 transfers the charge from the low-response photodiode PD2 to the floating diffusion FD to create the voltage $V_2$. Switch S2 225 is used to capture $V_2$. Fourth, pulses Tx1 230 and Tx2 235 transfer the charge from the high-response photodiode PD1 through the low-response photodiode PD2 to the floating diffusion FD where it is added to the low-response charge already present to create voltage $V_3$. Switch S3 240 is used to capture $V_3$. Fifth, after switch S3 goes low 245, Comp_en goes high 250 to enable comparator Comp1. If the voltage $V_2$ is higher than the threshold voltage $V_T$ (Case 2) 255, sel will be high and $\overline{sel}$ (sel complement) will be low. Hence, $V_2$, Voutm, and sel are read out. In contrast, if the voltage $V_2$ is lower than the threshold voltage $V_T$ (Case 1) 260, sel will be low and $\overline{sel}$ will be high. As a result, $V_3$, Voutm, and sel are read out. Comparator outputs sel and $\overline{sel}$ are non-overlap signals for the purpose of avoiding charge sharing between capacitors $C_2$ and $C_3$. In this embodiment, the threshold voltage $V_T$ is adjusted to get an optimized dynamic range. The signal for the low end of the optical response is the difference of high-response signal $V_3$ and combined reset Voutm. The signal for the high end of the optical response is the difference of low-response signal $V_2$ and combined reset Voutm. The two signals have significantly different responses because the high-response photodiode PD1 is designed to have higher quantum efficiency than the low-response photodiode PD2.

As previously mentioned regarding FIG. 1B, Advantages of this approach include: 1) Both the high-response and the low-response signals use a correlated reset, removing the square root of two increase for uncorrelated double sampling (this removes two 3T-reset noises $\sqrt{KT/C_{FD}}$, equivalent to $\sqrt{2KT/C_{FD}}$). 2) A line readout only requires three readouts (combined reset; low-response readout; high-response readout). 3) Both low-response readout and high-response readout have the same polarity. This simplifies the design of column amplifier. An additional advantage of this approach is that the low-response photodiode PD2 can be designed to provide lower dark defects because it is an isolated diode which does not require contacts to interconnect layers as does the floating diffusion.

Figure 3:
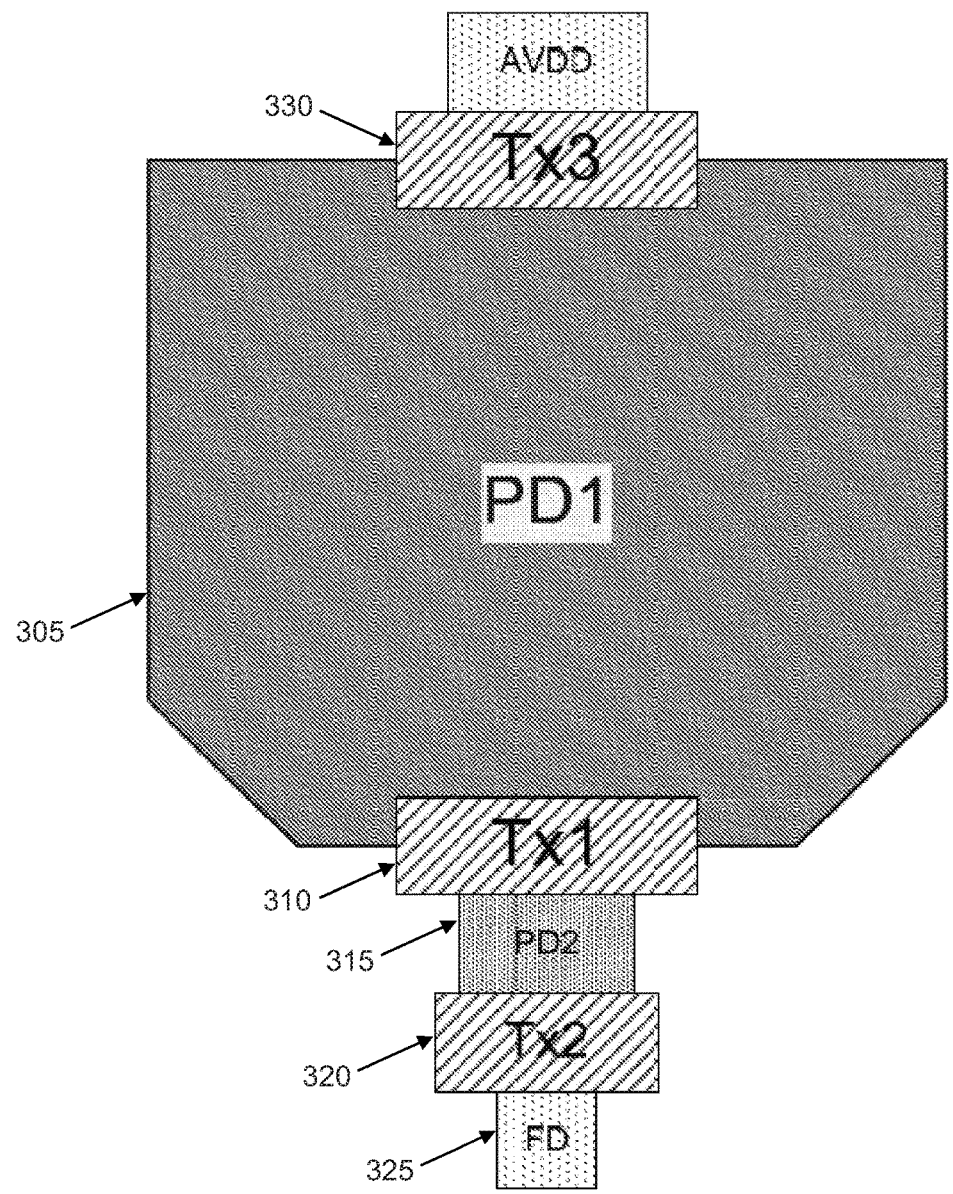
FIG. 3 shows a modified pixel configured in accordance with one embodiment.

FIG. 3 depicts a modified pixel 300. Components comprise high-response photodiode PD1 305, first transfer gate Tx1 310, low-response photodiode PD2 315, second transfer gate Tx2 320, floating diffusion FD 325, and third transfer gate Tx3 330. In embodiments, the low response signal is collected on dedicated low-response photodiode PD2 315 located between high-response photodiode PD1 305 and floating diffusion FD 325. Second transfer gate TX2 320 is added to control the charge transfer from low gain photodiode PD2 315 to floating diffusion 325.

Figure 4:
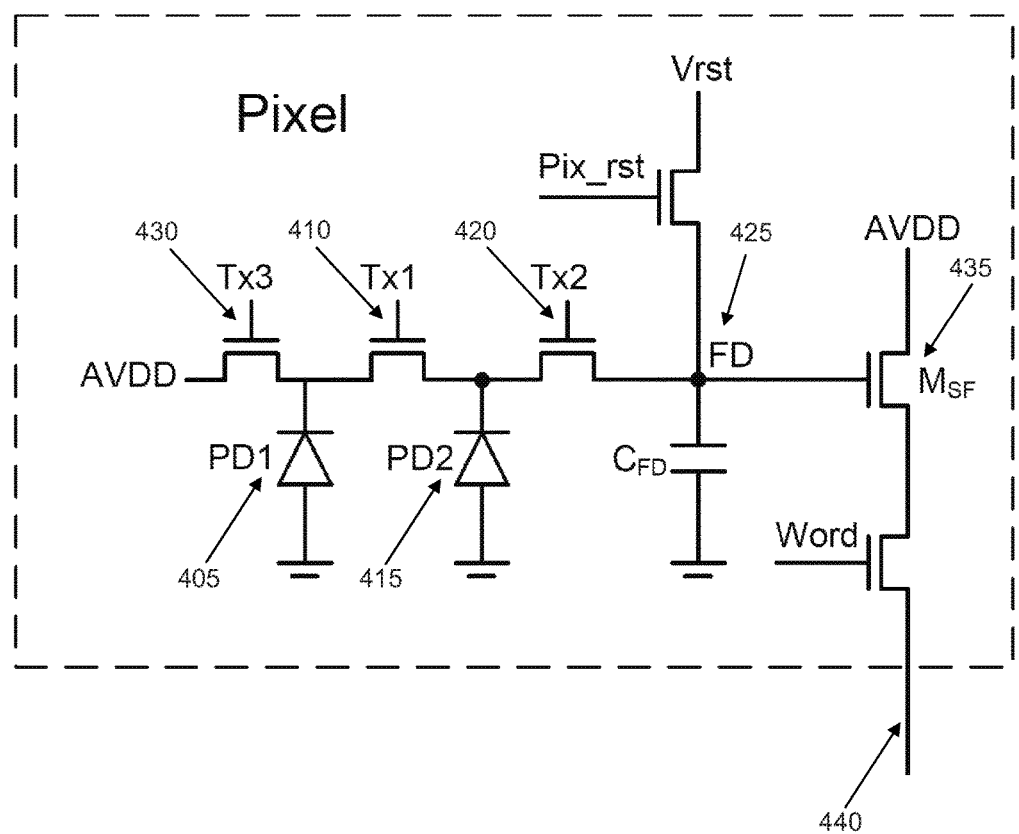
FIG. 4 shows a pixel circuit detail configured in accordance with one embodiment.

FIG. 4 shows pixel circuit embodiment detail 400. As depicted in FIG. 1B, the pixel consists of high-response photodiode PD1 405 that collects photocharge, first transfer gate Tx1 410 enables the charge to be transferred off high-response photodiode PD1 405 completely emptying it onto low-response photodiode PD2 415, second transfer gate Tx2 420 enables the charge to be transferred off low-response photodiode PD2 415, completely emptying it onto floating diffusion 425, third transfer gate Tx3 430 for anti-blooming; floating diffusion FD 425 collects the transferred charge creating a change of voltage, a means of resetting the floating diffusion, and source-follower $M_{SF}$ 435 which is modulated by the voltage on floating diffusion 425 to control bit-line voltage 440 and column-amplifier output Vout.

Again, advantages include (1) both the high-response and the low-response signals use a correlated reset removing the square root of two increase for uncorrelated double sampling; (2) a line readout only requires three readouts (combined reset; low-response readout; high response readout); (3) both low-response readout and high-response readout have the same polarity. An additional advantage is that the low-response photodiode can be designed to provide lower dark defects because it is an isolated diode which does not require contacts to an interconnect layer as does the floating diffusion.

Figure 5:
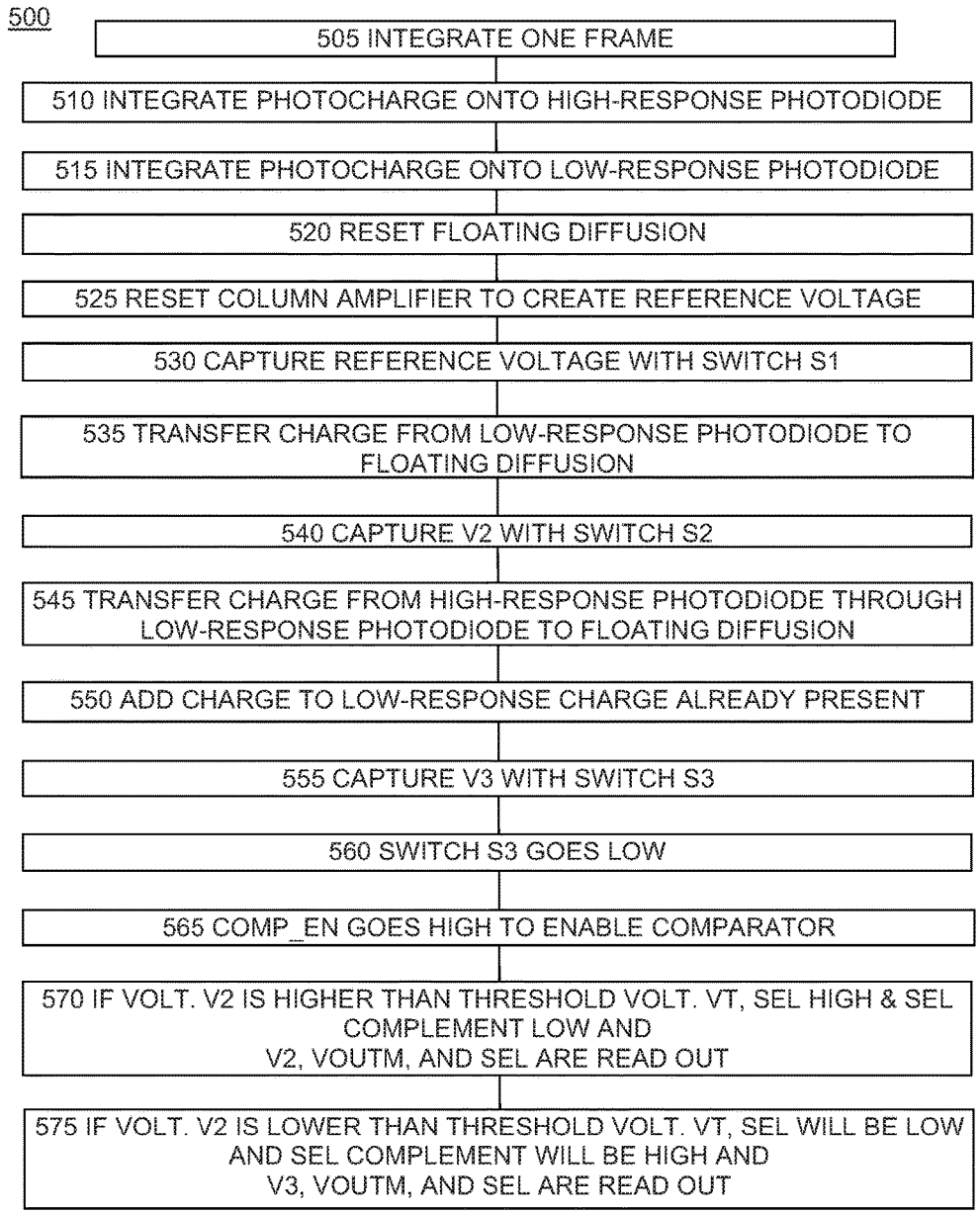
FIG. 5 is a method flow chart configured in accordance with an embodiment.

FIG. 5 is a method flow chart 500. Readout steps comprise, after one frame of integrating 505, integrating the photocharge onto both the high-response photodiode PD1 510 and onto the low-response photodiode PD2 515; next, a Px_rst pulse is used to reset floating diffusion FD 520. At this time, column amplifier A1 is also reset to create reference voltage Voutm 525. Switch S1 is used to capture the reference voltage 530. Next, Tx2 pulse transfers the charge from the low-response photodiode PD2 to floating diffusion FD 535 to create voltage $V_2$. Switch S2 is used to capture $V_2$ 540. Next, pulses Tx1 and Tx2 transfer the charge from the high-response photodiode PD1 through the low-response photodiode PD2 to floating diffusion FD 545 where it is added to the low-response charge already present 550 to create voltage $V_3$. Switch S3 is used to capture $V_3$ 555. Next, after switch S3 goes low 560, Comp_en goes high 565 to enable comparator Comp1. If the voltage $V_2$ is higher than the threshold voltage $V_T$ (Case 2), sel will be high and $\overline{sel}$ will be low 570. Hence, $V_2$, Voutm, and sel are read out. In contrast, if the voltage $V_2$ is lower than the threshold voltage $V_T$ (Case 1) 575, sel will be low and $\overline{sel}$ will be high. As a result, $V_3$, Voutm, and sel are read out. Comparator outputs sel and $\overline{sel}$ are designed to be non-overlap signals for the purpose of avoiding charge sharing between capacitors $C_2$ and $C_3$. In this embodiment, the threshold voltage $V_T$ is adjusted to get an optimized dynamic range. The signal for the low end of the optical response is the difference of high-response signal $V_3$ and combined reset Voutm. The signal for the high end of the optical response is the difference of low-response signal $V_2$ and combined reset Voutm. The two signals have significantly different responses because the high-response photodiode PD1 is designed to have higher quantum efficiency than the low-response photodiode PD2.

The foregoing description of the embodiments of the invention has been presented for the purposes of illustration and description. It is not intended to be exhaustive or to limit the precise form disclosed. Many modifications and variations are possible in light of this disclosure. It is intended that the scope be limited not by this detailed description, but rather by the claims appended hereto.

What is claimed is:

1. An ultra-high dynamic range two-photodiode pixel consisting of a first photodiode and a second photodiode said pixel further comprising:
    wherein said first photodiode is a high-response photodiode having a higher quantum efficiency than said second photodiode;
    a first transfer gate in electrical contact with said first photodiode;
    wherein said second photodiode is a low-response photodiode having a lower quantum efficiency than said first photodiode, and is in electrical contact with said first transfer gate;
    a second transfer gate in electrical contact with said second photodiode;
    a floating diffusion in electrical contact with said second transfer gate;
    a means of resetting said floating diffusion; and
    a source-follower in electrical contact with said floating diffusion.

2. The device of claim 1, wherein said high-response photodiode collects photocharge and said high-response photodiode has a higher quantum efficiency than said low-response photodiode.

3. The device of claim 1, wherein said first transfer gate enables a charge to be transferred off said high-response photodiode, completely emptying it onto said low-response photodiode.

4. The device of claim 1, wherein said second transfer gate enables a charge to be transferred off said low-response photodiode, completely emptying it onto said floating diffusion.

5. The device of claim 1, wherein said floating diffusion collects a transferred charge creating a change of voltage.

6. The device of claim 1, wherein said source-follower is modulated by a voltage on said floating diffusion to control a voltage on an output signal line.

7. The device of claim 1, wherein a photocharge is integrated onto both said high-response photodiode and onto said low-response photodiode.

8. The device of claim 1, wherein said low-response photodiode is an isolated diode without contacts to interconnect layers, thereby including lower dark defects.

9. The device of claim 1, further comprising a third transfer gate in electrical contact with said high-response photodiode.

10. A method for reading out an ultra-high dynamic range two-photodiode pixel comprising the steps of:
    integrating one frame;
    integrating a high-response photocharge onto a high-response photodiode;
    integrating a low-response photocharge onto a low-response photodiode;
    resetting a floating diffusion;
    resetting a column amplifier to create a reference voltage;
    capturing said reference voltage with a switch S1;
    transferring a low-response charge from said low-response photodiode to said floating diffusion;
    capturing a low-response signal voltage $V_2$ with a switch S2;
    transferring a high-response charge from said high-response photodiode through said low-response photodiode to said floating diffusion;
    adding a charge to said low-response charge already present;
    capturing a high-response signal voltage $V_3$ with a switch S3;
    said switch S3 going low;
    enabling a comparator by setting a comparator input Comp_en high;
    in said comparator, if said voltage $V_2$ is higher than a threshold voltage $V_T$, then sel is high and sel complement is low, and then a combined reset $V_{outm}$, said sel, and output $V_{outp}$, which is substantially equal to said voltage $V_2$, are read out; and
    in said comparator, if said voltage $V_2$ is lower than said threshold voltage $V_T$, then said sel is low and said sel complement is high, and then said combined reset $V_{outm}$, said sel, and said output $V_{outp}$, which is substantially equal to said voltage $V_3$, are read out.

11. The method of claim 10 wherein said sel comparator output and said sel complement comparator output are non-overlap signals, thereby avoiding charge sharing between capacitors $C_2$ and $C_3$, wherein said capacitor $C_2$ corresponds to said sel comparator output, said voltage $V_2$, and said switch S2, and said capacitor $C_3$ corresponds to said sel complement comparator output, said voltage $V_3$, and said switch S3.

12. The method of claim 10 wherein said threshold voltage $V_T$ is adjusted to get an optimized dynamic range.

13. The method of claim 10 wherein a signal for a low end of an optical response is a difference of said high-response signal voltage $V_3$ and said combined reset $V_{outm}$.

14. The method of claim 10 wherein a signal for a high end of an optical response is a difference of said low-response signal voltage $V_2$ and said combined reset $V_{outm}$.

15. The method of claim 10 wherein a signal for a low end of an optical response and a signal for a high end of an optical response have significantly different responses because said high-response photodiode has a higher quantum efficiency than said low-response photodiode.

16. The method of claim 10, wherein a line readout requires only three readouts of:
said combined reset $V_{outm}$, said low-response readout $V_2$, and said high-response readout $V_3$.

17. The method of claim 10, wherein a first transfer gate enables said high-response charge to be transferred off said high-response photodiode, completely emptying it onto said low-response photodiode.

18. The method of claim 10, wherein a second transfer gate enables said low-response charge to be transferred off said low-response photodiode completely emptying it onto said floating diffusion.

19. The method of claim 10, wherein both low-response readout and high-response readout have a same polarity.

20. An ultra-high dynamic range two-photodiode pixel imaging system comprising:
a high-response photodiode;
a first transfer gate in electrical contact with said high-response photodiode;
a low-response photodiode in electrical contact with said first transfer gate;
a second transfer gate in electrical contact with said low-response photodiode;
a floating diffusion in electrical contact with said second transfer gate;
a means of resetting said floating diffusion;
a source-follower in electrical contact with said floating diffusion;
integrating a high-response photocharge onto said high-response photodiode;
integrating a low-response photocharge onto said low-response photodiode, wherein amounts of said high response charge and said low response charge integrated onto said high-response and said low-response photodiodes are different;
resetting said floating diffusion;
resetting a column amplifier to create a reference voltage;
capturing said reference voltage with a switch S1;
transferring a low-response charge from said low-responsse photodiode to said floating diffusion;
capturing a low-response signal voltage $V_2$ with a switch S2;
transferring a high-response charge from said high-response photodiode through said low-response photodiode to said floating diffusion;
adding a charge to said low-response charge already present;
capturing a high-response signal voltage $V_3$ with a switch S3;
said switch S3 going low;
enabling a comparator by setting a comparator input Comp_en high;
in said comparator, if said voltage $V_2$ is higher than a threshold voltage $V_T$, then sel is high and sel complement is low, and then a combined reset $V_{outm}$, said sel, and output $V_{outp}$, which is substantially equal to said voltage $V_2$, are read out; and
in said comparator, if said voltage $V_2$ is lower than said threshold voltage $V_T$, then said sel is low and said sel complement is high, and then said combined reset $V_{outm}$, said sel, and said output $V_{outp}$, which is substantially equal to said voltage $V_3$, are read out.

21. The device of claim 1, wherein the high-response photodiode and the low-response photodiode are proximate each other and at substantially the same depth.

22. The device of claim 1, wherein the high-response photodiode and the low-response photodiode are different sizes.

23. The device of claim 1, wherein the high-response photodiode and the low-response photodiode extend a dynamic range but do not perform color separation.

* * * * *